United States Patent [19]

Yatsuda et al.

[11] Patent Number: 4,668,970
[45] Date of Patent: May 26, 1987

[54] SEMICONDUCTOR DEVICE

[75] Inventors: Yuji Yatsuda, Tsukui; Takaaki Hagiwara, Nishitama; Masatada Horiuchi, Koganei; Shinichi Minami, Hachioji; Toru Kaga, Kokubunji, all of Japan

[73] Assignee: Hitachi, Ltd., Tokyo, Japan

[21] Appl. No.: 803,789

[22] Filed: Dec. 2, 1985

Related U.S. Application Data

[63] Continuation of Ser. No. 461,021, Jan. 26, 1983, abandoned.

[30] Foreign Application Priority Data

Jan. 29, 1982 [JP] Japan ................................. 57-11652

[51] Int. Cl.⁴ ............................................. H01L 29/78
[52] U.S. Cl. ...................... 357/23.5; 357/54; 365/185
[58] Field of Search .................... 357/23.5, 54, 41; 365/185

[56] References Cited

U.S. PATENT DOCUMENTS

| 4,203,158 | 5/1980 | Frohman-Bentchkowsky et al. | 365/185 |
| 4,377,857 | 3/1983 | Tickle | 357/23 VT |
| 4,477,825 | 10/1984 | Yaron et al. | 365/185 |

FOREIGN PATENT DOCUMENTS 3009719 9/1980 Fed. Rep. of Germany ..... 357/23.5

Primary Examiner—Martin H. Edlow
Assistant Examiner—Mark Prenty
Attorney, Agent, or Firm—Antonelli, Terry & Wands

[57] ABSTRACT

In a semiconductor device which includes an insulation film through which a charge can tunnel, a gate insulation film of a material different from the material of said insulation film or having a thickness different from that of said insulation film, and a floating gate extending over said tunnelable insulation film, the improvement wherein at least two sides of said tunnelable region are bounded by a device separation oxide film.

5 Claims, 10 Drawing Figures (a)

(b)

(a)

(b)

SEMICONDUCTOR DEVICE

This application is a continuation of application Ser. No. 461,021, filed Jan. 26, 1983, and now abandoned.

BACKGROUND OF THE INVENTION

1. Field of the Invention

This invention relates to a semiconductor device, and in particular to the structure of a device which stabilizes the data writing and clearing properties with a high level of reproducibility of a nonvolatile floating gate memory having a tunnelable insulation film.

2. Description of the Prior Art

A conventional nonvolatile floating gate memory utilizing the tunnel phenomenon customarily has a structure in which a thin $SiO_2$ film 4 is formed over the entire surface of a channel, as shown in FIG. 1, or over a part within the channel, as shown in FIG. 2, or over an aperture in part of a source-drain diffusion layer as shown in FIG. 3(b), and a floating gate 5 extends over the $SiO_2$ film 4. FIG. 3(a) is a plane view of FIG. 3(b). A voltage which is effectively positive or negative with respect to the potential of the surface of the Si substrate 1 below the thin $SiO_2$ film 4 is applied to the gate 5 so that a charge having a different polarity is stored in the floating gate 5, and changes in the threshold voltage of the device are used as data in the memory. In these devices which have a partial tunnelable insulation film as described above, especially in those which have a tunnelable film over an $n^+$ region 3, however, a sufficient margin must be secured to define the region over which this film is to be formed, otherwise the film area is determined by the masking accuracy. In either of these cases, the area of the tunnelable region is determined by the minimum processing dimensions of the photolithography.

In FIGS. 1 through 3, reference numeral 1 denotes the Si substrate, 2 the source (or drain), 3 the drain (or source), 4 the tunnelable insulation film, 40 the insulation film, 5 the floating gate, and 6 a control gate.

In conventional devices, it is necessary that the tunnelable region is electrically connected to the source-drain region or to the channel region. For this reason, the tunnelable region is generally formed over the source or drain or within the channel.

3. List of the Prior Art

The following is cited as an example of the state of art:

Japanese Patent Laid-Open No. 9388/1975

SUMMARY OF THE INVENTION

It is therefore an object of the present invention to provide a semiconductor device which can eliminate the above problems with prior art devices, and can reduce the area of the tunnelable region to less than the minimum processing dimensions of photolithography.

To accomplish this object, the present invention is based on a technical concept which is completely different from the conventional concept and employs a structure in which the tunnelable region is provided in a region separated from the source-drain or channel regions by a device separation oxide film and is surrounded by the device separation oxide film. An electrical connection means which is different from that of the channel or source-drain is employed to establish the electrical connection. According to this arrangement, the present invention provides means for (1) eliminating dimensional non-uniformities of the tunnelable region due to masking errors; and (2) realize a tunnelable region of a size below the minimum processing dimensions of photolithography.

These and other objects and features of the present invention will become more apparent from the following description taken in conjunction with the accompanying drawings.

DETAILED DESCRIPTION OF THE PREFERRED EMBODIMENTS

Preferred embodiments of the present invention will be described below with reference to the accompanying drawings.

FIGS. 4(a) and 4(b) are plane and schematic sectional views, respectively, of the floating gate MOS transistor device in accordance with one embodiment of the present invention.

In FIG. 4(a), a diffusion region 32 for electric connection is provided outside and adjacent to a drain diffusion region 33 and a tunnelable region 4 is provided inside the diffusion region 32. The tunnel region 4 and gate regions 5, 6 are disposed sequentially within the region 32. FIG. 4(b) is a sectional view taken along the line X—X' of FIG. 4(a).

Figure 5:
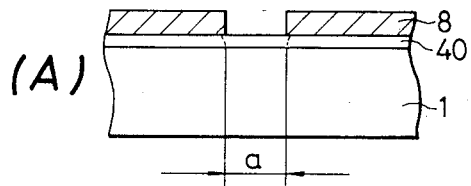
FIGS. 5(a) and 5(b) are sectional views of a conventional device showing the mode of determining the tunnelable region by photolithography.
Figure 5:
Figure 6:
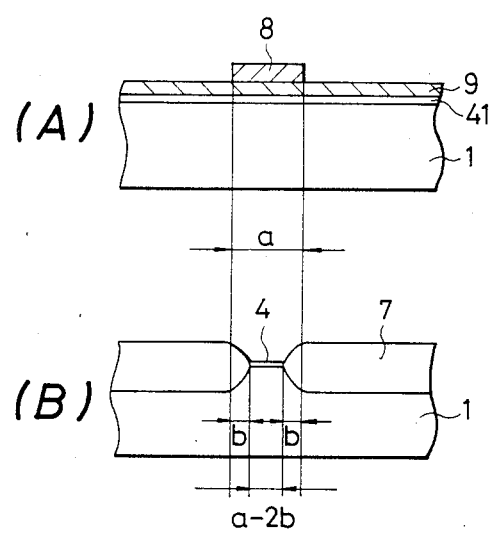
FIGS. 6(a) and 6(b) are sectional views of the device of the present invention showing that the tunnelable region can be formed in a size smaller than that determined by photolithography.

In accordance with the embodiment described above, the tunnelable region 4 is defined by a device separation oxide film so that there are no non-uniformities in the areas of the tunnelable regions due to masking errors. The reason will now be explained. Assume that the minimum processing dimension of photolithography is a and the width of a "bird's beak" due to lateral oxidation of an oxide film formed by the so-called LOCOS (Local Oxidation Of Silicon) process is b. In accordance with the prior art process, the minimum size of the tunnel region 4 is a as shown in FIG. 5 whereas the minimum size can be made to be $(a-2b)$ by utilizing the width b in the transverse direction in accordance with the present invention, as depicted in FIG. 6. In FIGS. 5 and 6, reference numeral 1 denotes an Si substrate, 4 a tunnelable insulation film, 7 the device separation oxide film, 8 a photoresist, and 9 a mask for selective oxidation which is generally $Si_3N_4$.

In order to form the tunnelable region 4, the present invention does not particularly require any new additional steps. On the contrary, forming the region 4 can be advantageously carried out concurrently with the step of providing the device separation oxide film.

Figure 1:
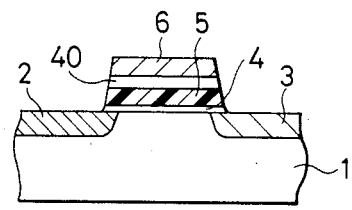
FIG. 1 is a sectional view of a conventional floating gate MOS transistor device having a tunnelable film over its entire surface.
Figure 2:
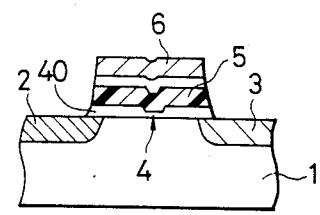
FIG. 2 is a sectional view of the above type of device having a tunnelable film over part of the channel.
Figure 3:
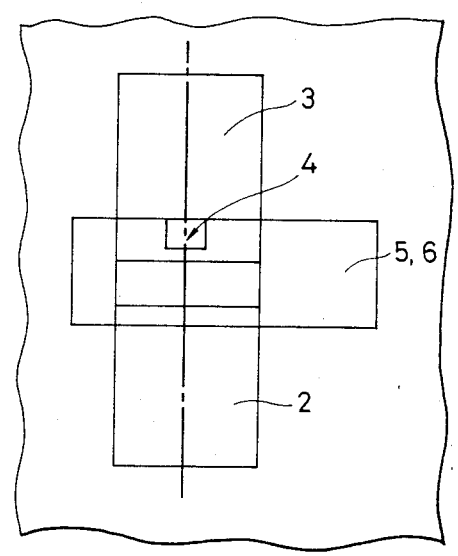
FIGS. 3(a) and 3(b) are plane and sectional views, respectively, of the above type of device having a tunnelable film over an $n^+$ diffusion layer.
Figure 3:
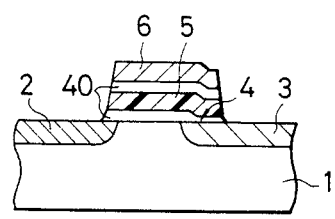
Figure 4:
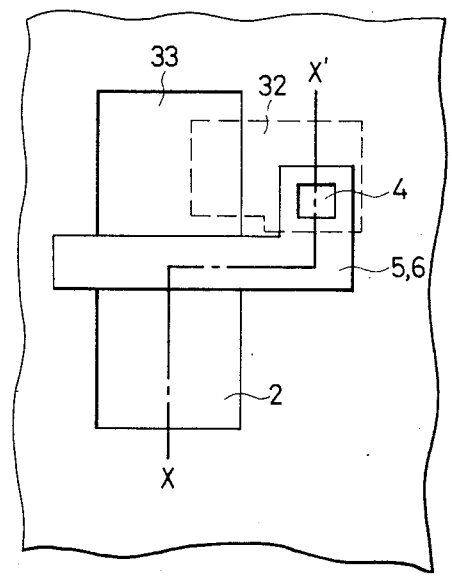
FIGS. 4(a) and 4(b) are plane and sectional views, respectively, of the above type of device having a tunnelable film over an n diffusion layer and covered therearound with a device separation film as an embodiment of the present invention.
Figure 4:
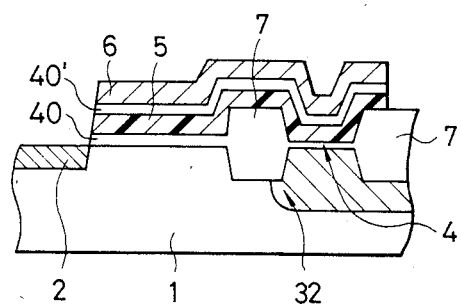

A process for fabricating the device of the embodiment described above will now be described with reference to FIG. 4. 0.1 to 1 μm deep n-type impurity diffusion layer, 32 (e.g. As and Sb or P) is first formed in a predetermined region of the surface of a p-type (100) Si substrate 1. The device separation oxide film 7 is then formed with a film thickness of one to several microns in accordance with the so-called LOCOS. In this example, the part which will become the tunnelable region is positioned over the n-type impurity diffusion layer 32 and its periphery is covered with the device separation oxide film. After a gate oxide film 40 of the MOS is formed, a photoresist film is applied with a sufficient margin for masking in the predetermined tunnel region and the gate oxide film 40 is selectively removed, thereby exposing the surface of the substrate 1.

After the photoresist is subsequently removed, an SiO$_2$ film 4 is formed to a thickness of about 10 nm over the exposed surface of the substrate. (Other insulating films such as an Si$_3$N$_4$ film may be used instead of the SiO$_2$ film 4.) Thus, a floating gate (e.g. of polycrystalline silicon) 5 is formed. An inter-layer insulation film 40' (such as an SiO$_2$ or Si$_3$N$_4$ film about 50 nm thick, or a multi-layered combination of them) is formed and a control gate 6 is then formed (of polycrystalline silicon, for example). Source and drain diffusion layers 2 and 32 are then formed (by ion implantation of P or As, for example). Thereafter, an aluminum wiring layer and the predetermined regions are electrically connected in the same way as in the fabrication or ordinary n-type MOS transistors.

Although the foregoing embodiment deals with the case in which the tunnelable region is completely surrounded by the device separation oxide film, the device of the invention may be bounded by the device separation oxide film in at least two directions and substantially the same effect can be obtained in such a case. Since the construction and fabrication method are substantially the same as those of the above embodiment, they are not described in detail.

As described above, the present invention makes it possible to easily form a tunnelable region outside the source and drain regions or outside the gate region, hence, the device of the invention can be easily applied to a memory circuit using floating gate MOS transistors and can provide excellent and stable data writing and clearing properties with a high level of reproducibility.

What is claimed is:

1. A semiconductor device comprising:
   a substrate having a first conductivity type and having first and second main surfaces opposite to one another;
   source and drain regions of a second conductivity type formed within the first main surface of said substrate and separated from one another by a predetermined portion of said substrate;
   an impurity region of said second conductivity type formed within said first main surface of said substrate in electrical contact with one of said source and drain regions;
   a gate insulating film formed on said first main surface of said substrate and over said pedetermined portion of said substrate between said source and drain regions;
   a thick device separating oxide film formed by a LOCOS process over a first portion of said impurity region, and having a bottom surface which is below said first main surface of said substrate;
   a thin insulating film through which charges can tunnel to thereby form a tunnelable region, said thin insulating film being formed on a second portion of said impurity region so that said tunnelable region is bounded on at least two sides thereof by said thick device separating oxide film;
   a floating gate electrode formed over both said gate insulating film and said thin insulating film; and
   a control gate electrode formed over an insulator formed over said floating gate electrode,
   wherein said impurity region extends under said thick device separating oxide film to electrically connect said tunnelable region with said one of said source and drain regions.

2. A semiconductor device comprising:
   a substrate having a first conductivity type and having first and second main surfaces opposite to one another;
   source and drain regions of a second conductivity type formed within the first main surface of said substrate and separated from one another by a predetermined portion of said substrate;
   an impurity region of said second conductivity type formed within said first main surface of said substrate in electrical contact with one of said source and drain regions;
   a gate insulating film formed on said first main surface of said substrate and over said predetermined portion of said substrate between said source and drain regions;
   a thick device separating oxide film formed by a LOCOS process over a first portion of said impurity region, and having a bottom surface which is below said first main surface of said substrate;
   a thin insulating film through which charges can tunnel to thereby form a tunnelable region, said thin insulating film being formed on a second portion of said impurity region so that said tunnelable region is bounded on at least two sides thereof by said thick device separating oxide film;
   a floating gate electrode formed over both said gate insulating film and said thin insulating film; and
   a control gate electrode formed over an insulator formed over said floating gate electrode,
   wherein the entire peripheral edge of said tunnelable region is in contact with the thick device separating oxide film.

3. A semiconductor device according to claim 1, further comprising an additional gate insulating film formed over said floating electrode and a second gate electrode formed over said additional gate insulating film.

4. A semiconductor device according to claim 2, further comprising an additional gate insulating film formed over said floating electrode and a second gate electrode formed over said additional gate insulating film.

5. A semiconductor device comprising:
   a substrate having a first conductivity type and having first and second main surfaces opposite to one another;
   source and drain regions of a second conductivity type formed within the first main surface of said substrate and separated from one another by a predetermined portion of said substrate;

an impurity region of said second conductivity type formed within said first main surface of said substrate in electrical contact with one of said source and drain regions;

a gate insulating film formed on said first main surface of said substrate and over said predetermined portion of said substrate between said source and drain regions;

a thick device separating oxide film formed by a LOCOS process over a first portion of said impurity region, and having a bottom surface which is below said first main surface of said substrate;

a thin insulating film through which charges can tunnel to thereby form a tunnelable region, said thin insulating film being formed on a second portion of said impurity region so that said tunnelable region is bounded on at least two sides thereof by said thick device separating oxide film;

a floating gate electrode formed over both said gate insulating film and said thin insulating film; and a control gate electrode formed over an insulator formed over said floating gate electrode, wherein said impurity region is a diffused region formed deeper from the surface of said substrate than said source and drain regions.

* * * * *